United States Patent
Nakata et al.

(10) Patent No.: US 11,715,648 B2
(45) Date of Patent: Aug. 1, 2023

(54) SUBSTRATE PROCESSING APPARATUS AND SUBSTRATE DRYING METHOD

(71) Applicant: Tokyo Electron Limited, Tokyo (JP)

(72) Inventors: Katsuya Nakata, Kumamoto (JP); Shogo Fukui, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 420 days.

(21) Appl. No.: 16/936,977

(22) Filed: Jul. 23, 2020

(65) Prior Publication Data

US 2021/0043471 A1  Feb. 11, 2021

(30) Foreign Application Priority Data

Aug. 5, 2019  (JP) .................................. 2019-143881

(51) Int. Cl.
*H01L 21/67* (2006.01)
*H01L 21/02* (2006.01)
*H01L 21/687* (2006.01)

(52) U.S. Cl.
CPC .. *H01L 21/67034* (2013.01); *H01L 21/02101* (2013.01); *H01L 21/67276* (2013.01); *H01L 21/68742* (2013.01)

(58) Field of Classification Search
CPC ......... H01L 21/02101; H01L 21/67034; H01L 21/67276; H01L 21/68742
USPC ....................................................... 134/95.2
See application file for complete search history.

(56) References Cited

U.S. PATENT DOCUMENTS 6,306,455 B1 * 10/2001 Takamori ............ H01L 21/6838
427/9
2018/0138060 A1 * 5/2018 Okamura ............ H01L 21/6719

FOREIGN PATENT DOCUMENTS

JP      2013-251550 A    12/2013

\* cited by examiner

*Primary Examiner* — Tinsae B Ayalew
(74) *Attorney, Agent, or Firm* — Venjuris, P.C.

(57) ABSTRACT

A substrate processing apparatus performs a drying process for drying a substrate with a liquid film formed on a pattern formation surface thereof, using a processing fluid in a supercritical state. The substrate processing apparatus includes a processing container, a holder, and a processing liquid supply. The processing container accommodates the substrate. The holder holds the substrate inside the processing container. The processing liquid supply supplies a processing fluid into the processing container. Further, the holder includes a base, a plurality of support members, and a lifting mechanism. The base is disposed below the substrate. The plurality of support members are provided on the base, and support the substrate from below. The lifting mechanism moves the plurality of support members up and down.

12 Claims, 10 Drawing Sheets

SUBSTRATE PROCESSING APPARATUS AND SUBSTRATE DRYING METHOD

CROSS-REFERENCE TO RELATED APPLICATIONS

This application is based on and claims priority from Japanese Patent Application No. 2019-143881, filed on Aug. 5, 2019, with the Japan Patent Office, the disclosure of which is incorporated herein in its entirety by reference.

TECHNICAL FIELD

The present disclosure relates to a substrate processing apparatus and a substrate drying method.

BACKGROUND

In the related art, as for a drying process performed after an upper surface of a substrate such as a semiconductor wafer is processed with a liquid, a technique is known which dries the substrate by bringing the substrate with the upper surface wet by the liquid into contact with a processing fluid in a supercritical state. See, for example, Japanese Patent Laid-Open Publication No. 2013-251550.

SUMMARY

A substrate processing apparatus according to an aspect of the present disclosure performs a drying process for drying a substrate with a liquid film formed on a pattern formation surface thereof, using a processing fluid in a supercritical state. The substrate processing apparatus includes a processing container, a holder, and a processing fluid supply. The processing container accommodates the substrate. The holder holds the substrate inside the processing container. The processing fluid supply supplies a processing fluid into the processing container. Further, the holder includes a base, a plurality of support members, and a lifting mechanism. The base is disposed below the substrate. The plurality of support members are provided on the base, and support the substrate from below. The lifting mechanism moves the plurality of support members up and down.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
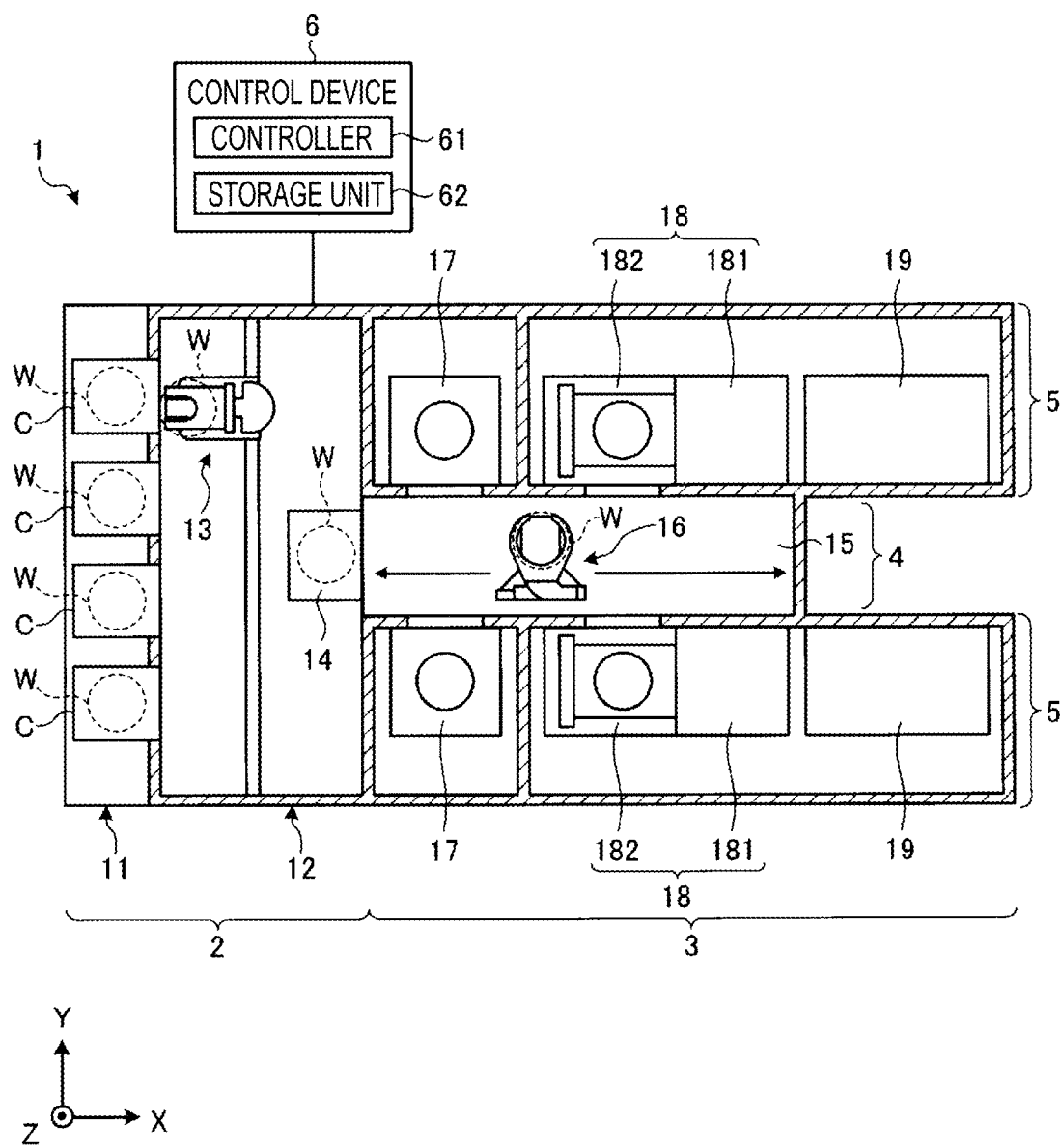
FIG. 1 is a view illustrating a configuration of a substrate processing system according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for implementing a substrate processing apparatus and a substrate drying method according to the present disclosure (hereinafter, referred to as "embodiments") will be described in detail with reference to the accompanying drawings. The substrate processing apparatus and the substrate drying method according to the present disclosure are not limited to the embodiments. The embodiments may be appropriately combined with each other within a scope that does not cause any inconsistency in process contents. In the embodiments, similar portions will be denoted by the same reference numerals, and overlapping descriptions thereof will be omitted.

In each drawing to be referred to herein below, an orthogonal coordinate system may be represented in which an X-axis direction, a Y-axis direction, and a Z-axis direction are defined to be orthogonal to each other, and the Z-axis positive direction is a vertically upward direction, in order to facilitate the understanding of descriptions. A direction of a rotation around a vertical axis may be referred to as the $\theta$ direction.

In the embodiments described below, terms "constant," "orthogonal," "vertical" or "parallel" may be used, and may not indicate accurately "constant," "orthogonal," "vertical" or "parallel." That is, each of the terms allows a difference in manufacturing accuracy, installation accuracy or the like.

[1. Configuration of Substrate Processing System]

First, a configuration of a substrate processing system according to an embodiment will be described with reference to FIG. 1. FIG. 1 is a view illustrating the configuration of the substrate processing system according to the embodiment.

As illustrated in FIG. 1, a substrate processing system 1 includes a carry-in/out station 2 and a processing station 3. The carry-in/out station 2 and the processing station 3 are provided adjacent to each other.

The carry-in/out station 2 includes a carrier placing section 11 and a transfer section 12. In the carrier placing section 11, a plurality of carriers C is placed to each accommodate a plurality of semiconductor wafers (hereinafter, referred to as "wafers W") horizontally.

The transfer section 12 is provided adjacent to the carrier placing section 11. A transfer device 13 and a delivery unit 14 are disposed inside the transfer section 12.

The transfer device 13 includes a wafer holding mechanism configured to hold a wafer W. The transfer device 13 is movable horizontally and vertically, and pivotable around the vertical axis. The transfer device 13 transfers wafers W between the carriers C and the delivery unit 14 by using the wafer holding mechanism.

The processing station 3 is provided adjacent to the transfer section 12. The processing station 3 includes a transfer block 4 and a plurality of processing blocks 5.

The transfer block 4 includes a transfer region 15 and a transfer device 16. The transfer region 15 is, for example, a rectangular parallelepiped region that extends along the alignment direction (the X-axis direction) of the carry-in/out station 2 and the processing station 3. A transfer device 16 is disposed in the transfer region 15.

The transfer device 16 includes a wafer holding mechanism that holds a wafer W. Further, the transfer device 16 is movable horizontally and vertically, and pivotable around the vertical axis. The transfer device 16 transfers wafers W between the delivery unit 14 and the plurality of processing blocks 5 by using the wafer holding mechanism.

The plurality of processing blocks 5 are arranged adjacent to the transfer region 15 on both sides of the transfer region 15. Specifically, the plurality of processing blocks 5 are arranged on one side of the transfer region 15 (in the Y-axis positive direction) and the other side of the transfer region 15 (in the Y-axis negative direction) in the direction (the Y-axis direction) orthogonal to the arrangement direction of the carry-in/out station 2 and the processing station 3 (the X-axis direction).

Each processing block 5 includes a liquid processing unit 17, a drying processing unit 18, and a supply unit 19.

The liquid processing unit 17 performs a cleaning process for cleaning the upper surface of a wafer W which is a pattern formation surface. Further, the liquid processing unit 17 performs a liquid film forming process for forming a liquid film on the upper surface of the wafer W after the cleaning process. The configuration of the liquid processing unit 17 will be described later.

The drying processing unit 18 performs a supercritical drying process on the wafer W that has been subjected to the liquid film forming process. Specifically, the drying processing unit 18 dries the wafer W that has been subjected to the liquid film forming process, by bringing the same wafer W into contact with a processing fluid in a supercritical state.

The drying processing unit 18 includes a processing region 181 where the supercritical drying process is performed, and a delivery region 182 where the wafer W is delivered between the transfer block 4 and the processing region 181. The processing region 181 and the delivery region 182 are arranged along the transfer region 15. The specific configuration of the drying processing unit 18 will be described later.

The supply unit 19 supplies the processing fluid to the drying processing unit 18. Specifically, the supply unit 19 is provided with a supply device group that includes a flow meter, a flow rate regulator, a back pressure valve, a heater and others, and a housing that accommodates the supply device group. In the embodiment, the supply unit 19 supplies $CO_2$ as the processing fluid to the drying processing unit 18.

The substrate processing system 1 includes a control device 6. The control device 6 is, for example, a computer, and includes a controller 61 and a storage unit 62. The configuration of the control device 6 will be described later.

[2. Configuration of Liquid Processing Unit]

Figure 2:
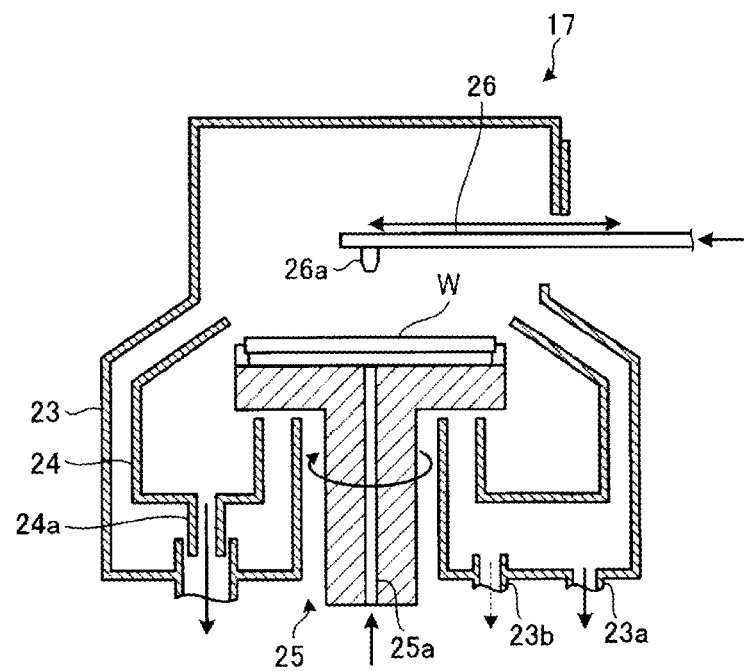
FIG. 2 is a view illustrating a configuration of a liquid processing unit according to the embodiment.

Next, a configuration of the liquid processing unit 17 will be described with reference to FIG. 2. FIG. 2 is a view illustrating the configuration of the liquid processing unit 17 according to the embodiment. The liquid processing unit 17 is configured by, for example, a single-wafer cleaning apparatus that cleans wafers W one by one by a spin cleaning.

As illustrated in FIG. 2, the liquid processing unit 17 holds a wafer W substantially horizontally on a wafer holding mechanism 25 disposed inside an outer chamber 23 that forms a processing space, and rotates the wafer holding mechanism 25 around the vertical axis so as to rotate the wafer W. Then, the liquid processing unit 17 causes a nozzle arm 26 to enter above the rotating wafer W, and supplies a chemical liquid or a rinse liquid in a predetermined order from a chemical liquid nozzle 26a provided at the tip of the nozzle arm 26, so as to perform the cleaning process on the upper surface of the wafer W.

A chemical liquid supply path 25a is formed inside the wafer holding mechanism 25 of the liquid processing unit 17. Thus, the lower surface of the wafer W is also cleaned with a chemical liquid or a rinse liquid supplied from the chemical liquid supply path 25a.

As for the cleaning process, particles or organic pollutants are first removed by, for example, SC1 liquid which is an alkaline chemical liquid (a mixed solution of ammonia and hydrogen peroxide), and then, a rinsing process is performed by deionized water (hereinafter, referred to as "DIW") which is a rinse liquid. Then, a native oxide film is removed by dilute hydrofluoric acid (hereinafter, referred to as "DHF") which is an acidic chemical liquid, and then, a rinse cleaning is performed by DIW.

The various chemical liquids described above are received by an inner cup 24 disposed inside the outer chamber 23, and are discharged from a drain port 23a provided in the bottom of the outer chamber 23 and a drain port 24a provided in the bottom of the inner cup 24. The atmosphere in the outer chamber 23 is exhausted from an exhaust port 23b provided in the bottom of the outer chamber 23.

The liquid film forming process is performed after the rinsing process of the cleaning process. Specifically, the liquid processing unit 17 supplies isopropyl alcohol (IPA) liquid to the upper surface and the lower surface of the wafer W while rotating the wafer holding mechanism 25. As a result, the DIW remaining on both the surfaces of the wafer W is replaced with the IPA. Then, the liquid processing unit 17 slowly stops the rotation of the wafer holding mechanism 25.

The wafer W that has subjected to the liquid film forming process is delivered to the transfer device 16 by a delivery mechanism (not illustrated) provided in the wafer holding mechanism 25, in a state where the liquid film of the IPA liquid is formed on the upper surface of the wafer W, and is carried out of the liquid processing unit 17. The liquid film formed on the wafer W prevents a collapse of patterns which may occur when the liquid on the upper surface of the wafer W is evaporated (vaporized) during the operation of transferring the wafer W from the liquid processing unit 17 to the drying processing unit 18 or the operation of carrying the wafer W into the drying processing unit 18.

[3. Configuration of Drying Processing Unit]

Figure 3:
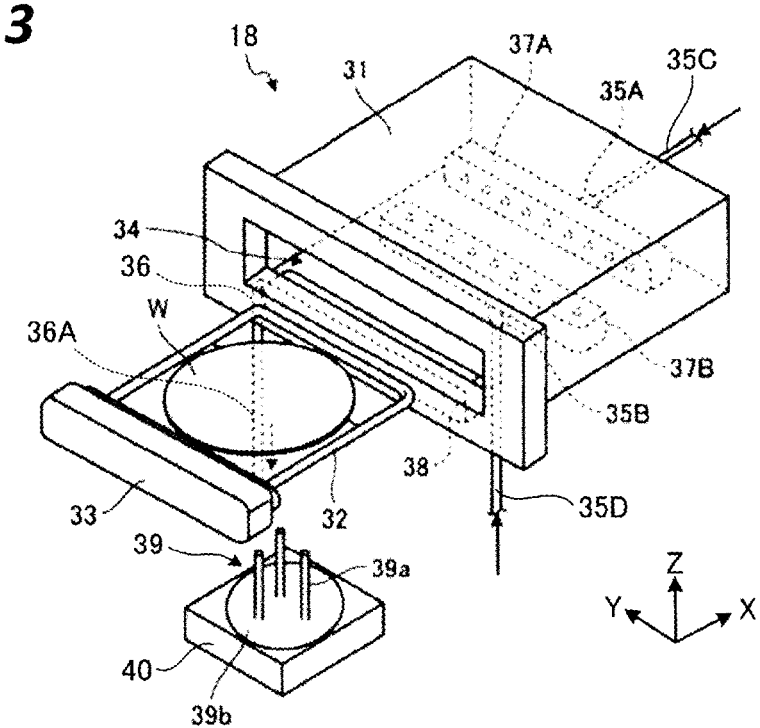
FIG. 3 is a perspective view illustrating the appearance of a drying processing unit according to the embodiment.
Figure 4:
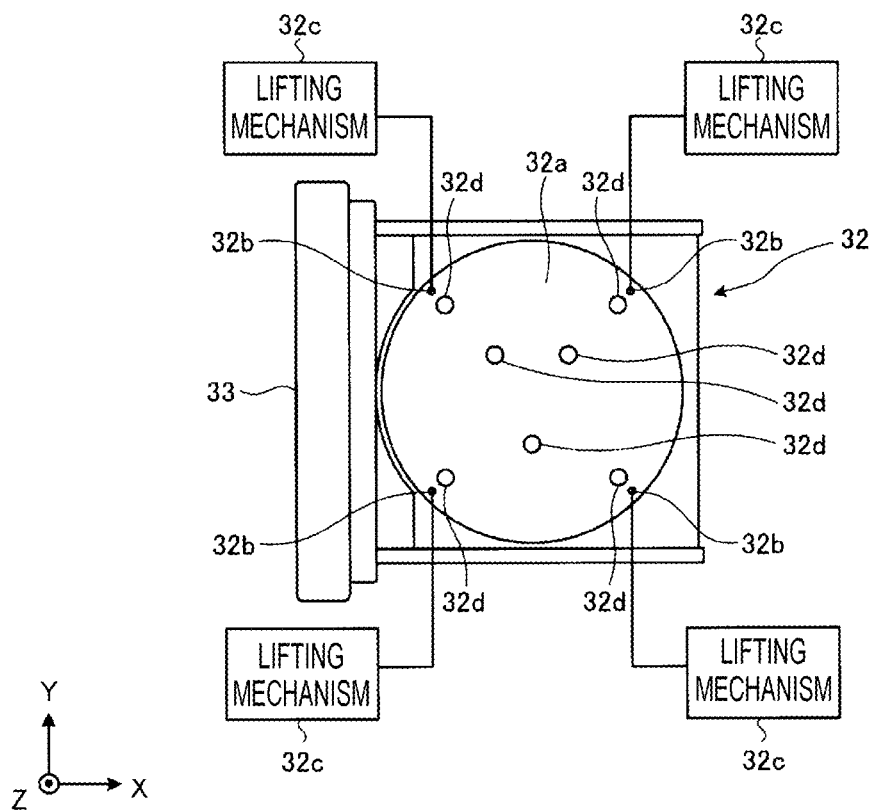
FIG. 4 is a plan view of a holder according to the embodiment.
Figure 5:
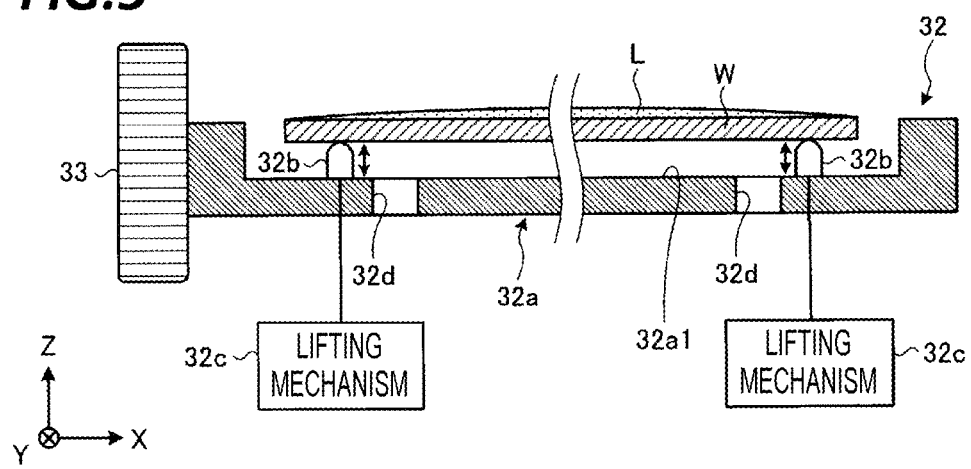
FIG. 5 is a side cross-sectional view of the holder according to the embodiment.
Figure 6:
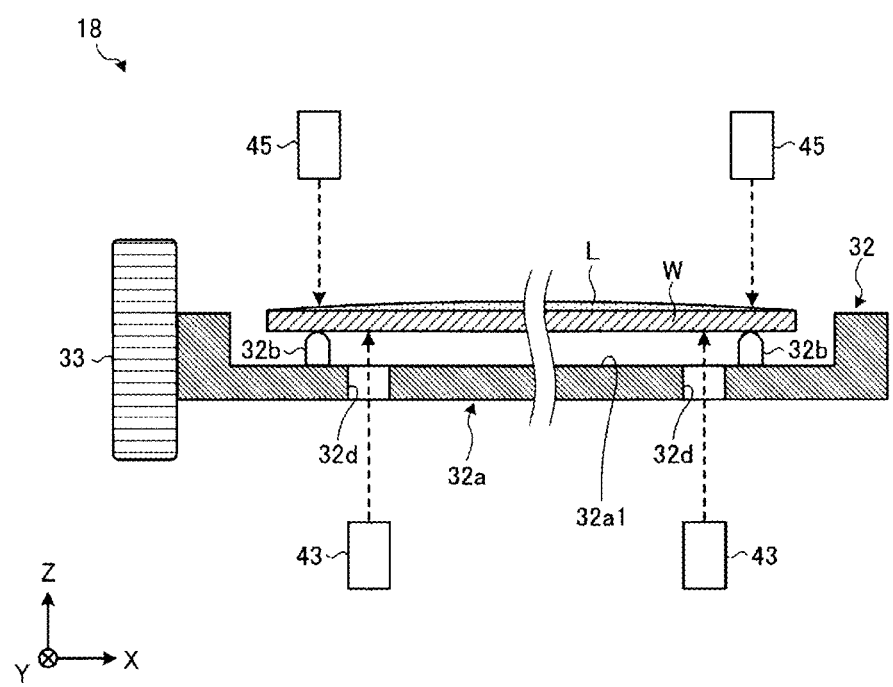
FIG. 6 is a view illustrating an arrangement of displacement sensors and film thickness sensors according to the embodiment.

Subsequently, a configuration of the drying processing unit 18 will be described with reference to FIGS. 3 to 6. FIG. 3 is a perspective view illustrating the appearance of the drying processing unit 18 according to the embodiment. FIG. 4 is a plan view of the holder according to the embodiment. FIG. 5 is a side cross-sectional view of the holder according to the embodiment. FIG. 6 is a view illustrating an arrangement of displacement sensors and film thickness sensors according to the embodiment.

As illustrated in FIG. 3, the drying processing unit 18 includes a processing container 31, a holder 32, a lid 33, a lifter 39, and a weight sensor 40.

The processing container 31 is a pressure container capable of forming a high pressure environment of, for example, about 16 MPa to 20 MPa. The processing container 31 is disposed in the processing region 181 (see FIG. 1), and the supercritical drying process is performed in a processing space 31a (see FIG. 8) which is the internal space of the processing container 31.

The holder 32 holds the wafer W horizontally. The lid 33 supports the holder 32. The lid 33 is connected to a moving mechanism (not illustrated), and moves horizontally between the processing region 181 and the delivery region 182 by the moving mechanism. When the lid 33 moves to the processing region 181, the holder 32 is disposed inside the processing container 31, and the lid 33 closes an opening 34 of the processing container 31.

Here, a specific configuration of the holder 32 will be described with reference to FIGS. 4 and 5. As illustrated in FIGS. 4 and 5, the holder 32 includes a base 32a, a plurality of support members 32b, a plurality of lifting mechanisms 32c, and a plurality of through holes 32d.

The base 32a is a plate-shaped member disposed below the wafer W. A circular recess is formed in the base 32a, and has a diameter larger than that of the wafer W. The wafer W is placed in the recess via the plurality of support members 32b to be described later.

The plurality of support members 32b are members that project upward from the bottom surface 32a1 of the recess formed in the base 32a, and support the outer peripheral portion of the wafer W from below. The wafer W goes into a state of floating from the base 32a by being supported by the plurality of support members 32b (see FIG. 5).

The plurality of lifting mechanisms 32c correspond to the plurality of support members 32b in a one-to-one manner, and move the corresponding supporting members 32b up and down, that is, along the vertical direction. The lifting mechanisms 32c may move the support members 32b up and down by a driving force of an electromotor such as a motor. Further, the lifting mechanisms 32c may move the support members 32b up and down by using an inverse piezoelectric effect of a piezo element. Further, the lifting mechanisms 32c may move the support members 32b up and down by using the air pressure.

Here, while an example where the four support members 32b and the four lifting mechanisms 32c are provided has been described, the number of sets of the support members 32b and the lifting mechanisms 32c is not limited to four. Here, while an example where the lifting mechanisms 32c are provided on all of the plurality of support members 32b has been described, the holder 32 may include one lifting mechanism 32c that moves, for example, one of the plurality of support members 32b up and down. That is, the holder 32 may include at least one lifting mechanism 32c that moves at least one of the plurality of support members 32b up and down.

Here, while an example where the plurality of support members 32b are individually moved up and down by the plurality of lifting mechanisms 32c has been described, the holder 32 may include one lifting mechanism 32c that collectively moves the plurality of support members 32b up and down.

The plurality of through holes 32d are formed in the bottom surface 32a1 of the recess formed in the base 32a, and penetrate the base 32a vertically. The plurality of through holes 32d are formed at radially inner portions of the circular recess formed in the base 32a from the plurality of support members 32b. The plurality of through holes 32d function as flow paths for the processing fluid supplied from the bottom surface 31c (see FIG. 8) of the processing space 31a. Among the plurality of through holes 32d, the three through holes 32d formed at the center of the circular recess also function as insertion through holes for lifter pins 39a to be described later. The number and the arrangement of the plurality of through holes 32d are not limited to the illustrated example.

As illustrated in FIG. 3, supply ports 35A and 35B and a discharge port 36 are provided in the walls of the processing container 31. The supply port 35A is connected to a supply line 35C that supplies the processing fluid into the processing space. The supply port 35B is connected to a supply line 35D that supplies the processing fluid into the processing space. The discharge port 36 is connected to a discharge line 36A that discharges the processing fluid from the processing space.

The supply port 35A is connected to the side surface of the processing container 31 opposite to the opening 34, and the supply port 35B is connected to the bottom surface of the processing container 31. The discharge port 36 is connected to a portion of the processing container 31 below the opening 34. The number of supply ports 35A and 35B and discharge port 36 are not particularly limited.

Fluid supply headers 37A and 37B and a fluid discharge header 38 are provided inside the processing container 31. Each of the fluid supply headers 37A and 37B and the fluid discharge header 38 has a large number of holes.

The fluid supply header 37A is connected to the supply port 35A, and provided adjacent to the side surface of the processing container 31 opposite to the opening 34 inside the processing container 31. The large number of holes formed in the fluid supply header 37A are directed toward the opening 34.

The fluid supply header 37B is connected to the supply port 35B, and provided at the center of the bottom surface of the processing container 31 inside the processing container 31. The large number of holes formed in the fluid supply header 37B are directed upward.

The fluid discharge header 38 is connected to the discharge port 36, is adjacent to the side surface of the processing container 31 close to the opening 34 inside the processing container 31, and is provided below the opening 34. The large number of holes formed in the fluid discharge header 38 are directed toward the fluid supply header 37A.

The drying processing unit 18 supplies a heated processing fluid from the fluid supply headers 37A and 37B into the processing container 31, and simultaneously, discharges the processing fluid inside the processing container 31 through the fluid discharge header 38. A damper is provided in the discharge path of the processing fluid to adjust a discharge amount of the processing fluid from the processing container 31, and the discharge amount of the processing fluid is adjusted by the damper such that the pressure inside the processing container 31 is adjusted to a desired pressure. As a result, the supercritical state of the processing fluid is maintained inside the processing container 31. Hereinafter, the processing fluid in the supercritical state will be referred to as a "supercritical fluid."

The IPA liquid that exists on the pattern formation surface (the upper surface) of the wafer W is gradually dissolved in the supercritical fluid by coming into contact with the supercritical fluid in a high pressure state (e.g., 16 MPa), and is finally replaced with the supercritical fluid. As a result, the gap among patterns goes into a state of being filled with the supercritical fluid.

Then, the drying processing unit 18 reduces the pressure in the processing container 31 from the high pressure state to the atmospheric pressure. As a result, the supercritical fluid that fills the gap among patterns changes into the processing fluid in the normal, that is, gas state.

As described above, the drying processing unit 18 replaces the IPA liquid existing on the pattern formation surface with the supercritical fluid, and then, returns the supercritical fluid to the gaseous processing fluid, so as to remove the IPA liquid from the pattern formation surface and dry the pattern formation surface.

The supercritical fluid has a viscosity lower than that of a liquid (e.g., the IPA liquid), and has a relatively high ability to dissolve the liquid. Further, no interface exists between the supercritical fluid and a liquid or gas in an equilibrium state. Accordingly, by performing the supercritical drying process, it is possible to dry a liquid without being affected by the surface tension. That is, the collapse of patterns may be suppressed during the drying process.

In the embodiment, the IPA liquid is used as the anti-drying liquid, and $CO_2$ is used as the processing fluid. However, a liquid other than IPA may be used as the anti-drying liquid, and a fluid other than $CO_2$ may be used as the processing fluid.

The lifter 39 includes a plurality of lifter pins 39$a$ and a support 39$b$ that is connected to the lower ends of the plurality of lifter pins 39$a$ and supports the plurality of lifter pins 39$a$.

The lifter 39 moves up and down by a lifting driving unit (not illustrated). Specifically, the lifter 39 moves up and down between a delivery position where the wafer W is delivered to and from the transfer device 16, and a standby position. The standby position is a position below the lid 33 and the holder 32 and does not interfere with the lid 33 and the holder 32.

The weight sensor 40 is, for example, a load cell. The weight sensor 40 is provided, for example, below the lifter 39 and measures the weight of the wafer W supported by the lifter 39. Specifically, the weight sensor 40 measures not only the weight of the wafer W after a liquid film L is formed on the wafer W by the liquid processing unit 17 but also the weight of the wafer W before the wafer W is accommodated in the processing container 31.

As illustrated in FIG. 6, the drying processing unit 18 further includes a plurality of displacement sensors 43 and a plurality of film thickness sensors 45. The plurality of displacement sensors 43 and the plurality of film thickness sensors 45 are arranged in, for example, the delivery region 182 (see FIG. 1), and measure the wafer W before the wafer W is carried into the processing container 31.

The plurality of displacement sensors 43 are arranged below the wafer W held by the holder 32, and measure the distance to the lower surface of the wafer W.

The plurality of displacement sensors 43 include four displacement sensors 43 that correspond to the four support members 32$b$. Each of the four displacement sensors 43 measures the distance to the lower surface of the wafer W around the corresponding support member 32$b$, via the through hole 32$d$ formed at a position closest to the corresponding support member 32$b$.

The plurality of film thickness sensors 45 are arranged above the wafer W held by the holder 32, and measure the film thickness of the liquid film L formed on the wafer W.

The plurality of film thickness sensors 45 include four film thickness sensors 45 that correspond to the four support members 32$b$. Each of the four film thickness sensors 45 is disposed above the corresponding support member 32$b$, and measures the film thickness of the liquid film L around the corresponding support member 32$b$.

[4. Configuration of Control Device]

Figure 7:
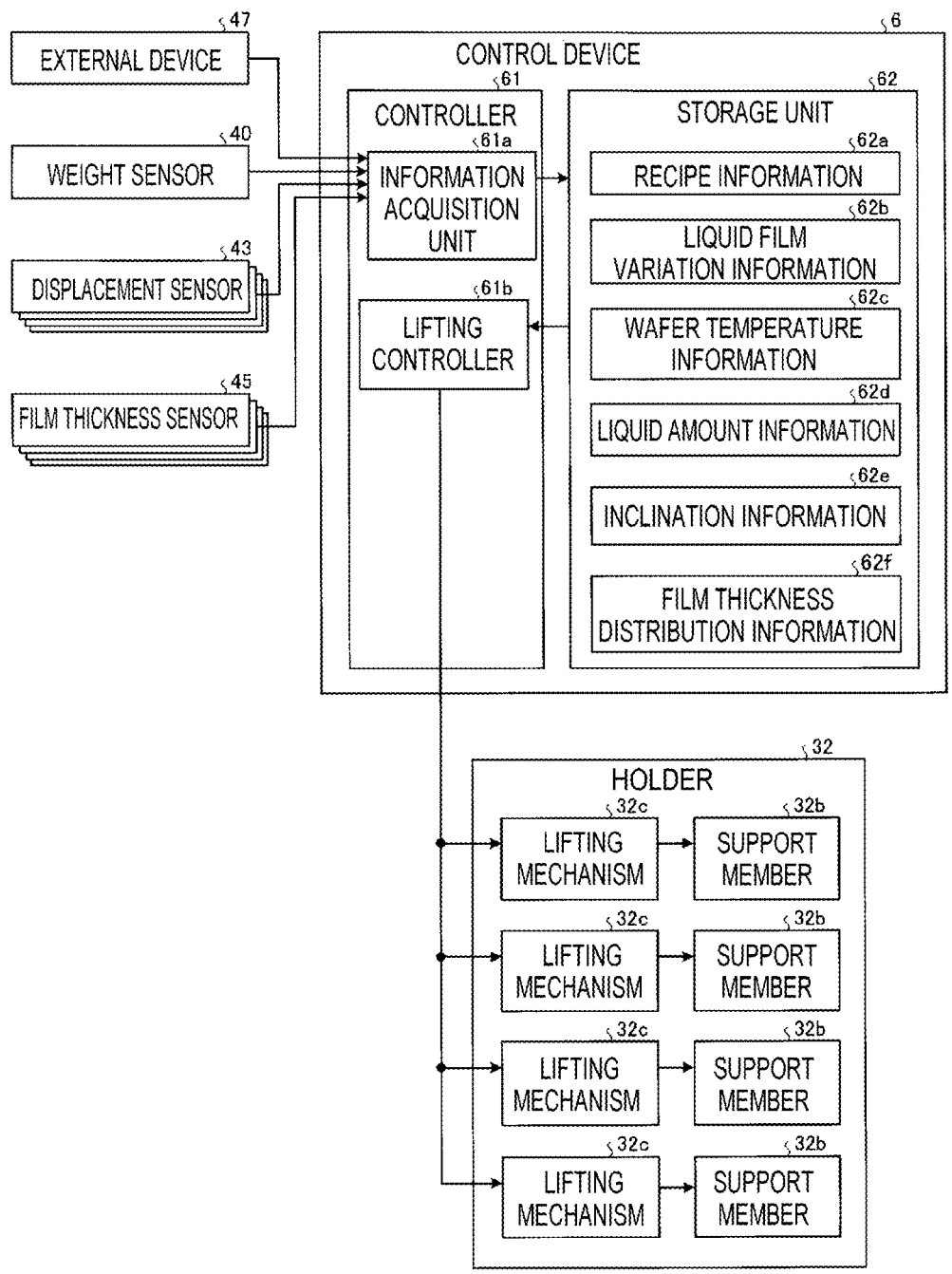
FIG. 7 is a block diagram illustrating a configuration of a control device according to the embodiment.

Next, a configuration of the control device 6 will be described with reference to FIG. 7. FIG. 7 is a block diagram illustrating the configuration of the control device 6 according to the embodiment.

As illustrated in FIG. 7, the control device 6 according to the embodiment includes a controller 61 and a storage unit 62. The controller 61 includes an information acquisition unit 61$a$ and a lifting controller 61$b$. The storage unit 62 stores recipe information 62$a$, liquid film variation information 62$b$, wafer temperature information 62$c$, liquid amount information 62$d$, inclination information 62$e$, and film thickness distribution information 62$f$.

Further, the control device 6 includes a computer having, for example, a CPU (central processing unit), a ROM (read only memory), a RAM (random access memory), an HDD (hard disk drive), and an input/output port, or various circuits.

For example, the CPU of the computer reads out programs stored in the ROM so as to function as the information acquisition unit 61$a$ and the lifting controller 61$b$ of the controller 61. At least one or both of the information acquisition unit 61$a$ and the lifting controller 61$b$ may be configured by hardware such as an ASIC (application specific integrated circuit) or an FPGA (field programmable gate array).

The storage unit 62 corresponds to, for example, the RAM or the HDD. The RAM or HDD may store the recipe information 62$a$, the liquid film variation information 62$b$, the wafer temperature information 62$c$, the liquid amount information 62$d$, the inclination information 62$e$, and the film thickness distribution information 62$f$.

The programs may be recorded in a computer-readable recording medium, and may be installed in the storage unit 62 of the control device 6 from the recording medium. Examples of the computer-readable recording medium include a hard disk (HD), a flexible disk (FD), a compact disk (CD), a magnet optical disk (MO), a memory card and others. Further, the control device 6 may acquire the programs described above or various kinds of information via another computer or a portable recording medium connected through a wired or wireless network.

The information acquisition unit 61$a$ is connected to an external device 47, the weight sensor 40, the plurality of displacement sensors 43, and the plurality of film thickness sensors 45, acquires various kinds of information therefrom, and stores the acquired information in the storage unit 62.

For example, the information acquisition unit 61a may acquire the recipe information 62a from the external device 47, and store the acquired recipe information in the storage unit 62. The recipe information 62a indicates contents of a processing to be executed by the substrate processing system 1, that is, processing conditions for the wafer W.

The recipe information 62a includes information such as a liquid amount of the liquid film L formed on the wafer W in the liquid film forming process and a liquid type of the liquid film L. Further, the recipe information 62a includes processing conditions such as a flow rate of the processing fluid in the drying process, and a pressure and a temperature inside the processing container 31. The controller 61 controls the liquid processing unit 17, the drying processing unit 18 and others according to the recipe information 62a, so as to cause the liquid processing unit 17, the drying processing unit 18 and others to perform the substrate processing such as the liquid film forming process and the drying process.

The recipe information 62a may not necessarily be acquired from the external device 47, and may be generated in, for example, the control device 6.

The information acquisition unit 61a may acquire the liquid film variation information 62b from the external device 47, and store the acquired liquid film variation information 62b in the storage unit 62. The liquid film variation information 62b indicates a variation of the liquid film L over time during the drying process. The liquid film variation information 62b may include information indicating a variation in liquid amount of the liquid film L over time during the drying process. Further, the liquid film variation information 62b may include information indicating a variation in film thickness of the liquid film L over time during the drying process. When the liquid film L aggregates in the drying process, the film thickness of the aggregated liquid film L may become larger than the initial film thickness. The liquid film variation information 62b may include information in film thickness of the liquid film L over time according to the aggregation.

The information acquisition unit 61a may acquire the wafer temperature information 62c from the external device 47, and store the acquired wafer temperature information 62c in the storage unit 62. The wafer temperature information 62c indicates the temperature of the wafer W during the drying process. The liquid film variation information 62b and the wafer temperature information 62c are obtained by a preliminary experiment or simulation.

The information acquisition unit 61a acquires the weight of the wafer W that has been subjected to the liquid film forming process, from the weight sensor 40. Further, the information acquisition unit 61a calculates a difference between the acquired weight of the wafer W that has been subjected to the liquid film forming process and a previously acquired weight of the wafer W before the liquid film forming process is performed, and calculates the liquid amount of the liquid film L formed on the wafer W based on the calculated difference. The information acquisition unit 61a stores the calculated liquid amount of the liquid film L as the liquid amount information 62d in the storage unit 62.

The information acquisition unit 61a acquires information on the distance from each of the plurality of displacement sensors 43 to the lower surface of the wafer W, and calculates the inclination of the wafer W based on the acquired information. Then, the information acquisition unit 61a stores the calculated inclination of the wafer W as the inclination information 62e in the storage unit 62.

The information acquisition unit 61a acquires information on the film thickness of the liquid film L from each of the plurality of film thickness sensors 45, and generates a film thickness distribution of the liquid film L on the wafer W based on the acquired information. Then, the information acquisition unit 61a stores the generated film thickness distribution of the liquid film L as the film thickness distribution information 62f in the storage unit 62.

The lifting controller 61b controls the plurality of lifting mechanisms 32c included in the holder 32 based on the various kinds of information stored in the storage unit 62, so as to collectively or individually move the plurality of support members 32b up and down.

[5. Flow of Supercritical Fluid]

Figure 8:
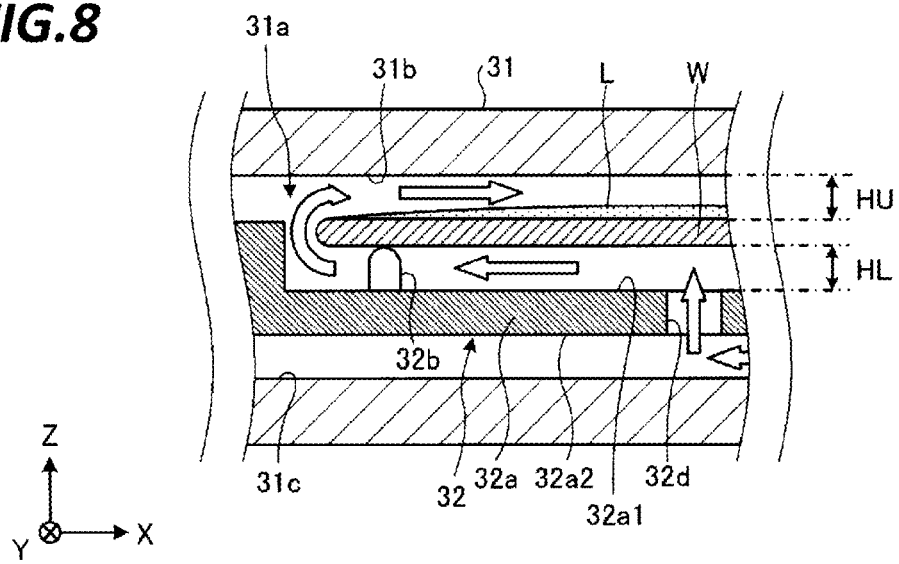
FIG. 8 is a view illustrating an example of a flow of a supercritical fluid in a processing space.

Next, the flow of the supercritical fluid in the processing container 31 will be described with reference to FIG. 8. FIG. 8 is a view illustrating an example of the flow of the supercritical fluid in the processing space.

As illustrated in FIG. 8, the holder 32 is disposed inside the processing space 31a of the processing container 31, at a height position where the holder 32 is not in contact with the ceiling surface 31b and the bottom surface 31c of the processing space 31a. The wafer W supported by the plurality of support members 32b is placed at a height position where the wafer W is not in contact the ceiling surface 31b of the processing space 31a and the bottom surface 32a1 of the base 32a.

A laminar flow of the supercritical fluid is formed inside the processing container 31. The laminar flow of the supercritical fluid is supplied into the processing space 31a from the fluid supply header 37B (see FIG. 3), and then, flows toward the X-axis negative direction between the lower surface 32a2 of the base 32a and the bottom surface 31c of the processing space 31a. Then, the laminar flow of the supercritical fluid reaches the lower surface of the wafer W through the through holes 32d, and then, flows between the lower surface of the wafer W and the bottom surface 32a1 of the base 32a toward the X-axis negative direction to reach the periphery of the wafer W. Then, the laminar flow of the supercritical fluid wraps around toward the upper surface of the wafer W, and flows between the ceiling surface 31b of the processing container 31 and the upper surface of the liquid film L formed on the wafer W toward the X-axis positive direction.

In this way, the laminar flow of the supercritical fluid flows between the lower surface of the wafer W and the bottom surface 32a1 of the holder 32, and between the ceiling surface 31b of the processing container 31 and the upper surface of the liquid film L. Here, the initial value of the distance between the lower surface of the wafer W and the bottom surface 32a1 of the base 32a, that is, the projection amount of the support members 32b is referred to as "HL." The initial value of the distance between the ceiling surface 31b of the processing container 31 and the upper surface of the wafer W is referred to as "HU."

[6. Lifting Control Process]

Figure 9:
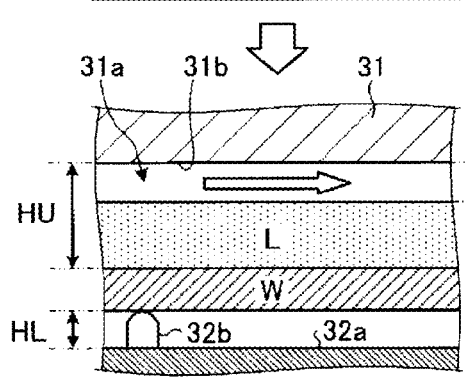
FIG. 9 is a view illustrating an example of a lifting control process using recipe information or liquid amount information.
Figure 9:
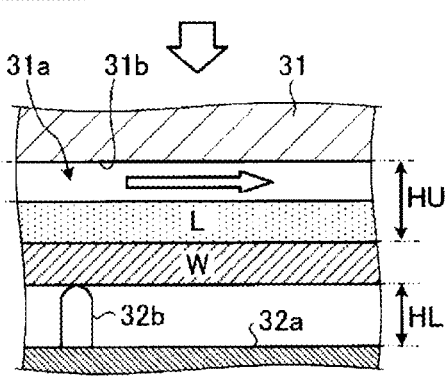

Next, an example of the lifting control process by the lifting controller 61b will be described with reference to FIGS. 9 to 15. First, an example of the lifting control process using the recipe information 62a or the liquid amount information 62d will be described with reference to FIG. 9. FIG. 9 is a view illustrating an example of the lifting control process using the recipe information 62a or the liquid amount information 62d.

As illustrated in FIG. 9, the lifting controller 61b may acquire the liquid amount of the liquid film L before the drying process is performed, from the recipe information 62a or the liquid amount information 62d stored in the storage unit 62. The lifting controller 61b may control the plurality of lifting mechanisms 32c to collectively move the plurality of support members 32b up or down, such that the height position of the wafer W inside the processing space 31a reaches the height position that corresponds to the liquid amount of the liquid film L before the drying process is performed.

Here, the "height position that corresponds to the liquid amount of the liquid film L before the drying process is performed" indicates the height position of the wafer W at which a distance G between the upper surface of the liquid film L before the start of the drying process and the ceiling surface 31b of the processing space 31a is constant at all times, regardless of the liquid amount of the liquid film L.

For example, when the liquid amount before the drying process is performed is Xa, the lifting controller 61b lowers the height of the plurality of support members 32b, as compared with that in a case where the liquid amount before the drying process is performed is Xb smaller than Xa. As a result, the gap between the ceiling surface 31b of the processing space 31a and the upper surface of the liquid film L which is the flow path of the supercritical fluid may be made constant. That is, the flow rate or flow velocity of the supercritical fluid that flows through the gap between the ceiling surface 31b of the processing space 31a and the upper surface of the liquid film L may be made constant, regardless of the liquid amount of the liquid film L before the drying process is performed.

In this way, the lifting controller 61b may move the plurality of support members 32b up or down according to the liquid amount of the liquid film. As a result, for example, the size of the gap between the ceiling surface 31b of the processing space 31a and the upper surface of the liquid film L may be accurately set, such that the flow rate or flow velocity of the supercritical fluid flowing on the upper surface of the liquid film L becomes the flow rate or flow velocity suitable for the drying process.

The control device 6 may store in advance correlation information indicating a correlation between the liquid amount of the liquid film L and the height of the plurality of support members 32b, in the storage unit 62. In this case, the lifting controller 61b may control the plurality of lifting mechanisms 32c to move the plurality of support members 32b up or down according to the correlation information stored in the storage unit 62.

The lifting controller 61b may perform the same lifting control process as described above, using the film thickness distribution information 62f stored in the storage unit 62. That is, the lifting controller 61b may control the plurality of lifting mechanisms 32c to collectively move the plurality of support members 32b up or down, such that the height position of the wafer W inside the processing space 31a reaches the height position that corresponds to the liquid amount of the liquid film L before the drying process is performed. In this way, the lifting controller 61b may move the plurality of support members 32b up or down according to the film thickness of the liquid film L.

Figure 10:
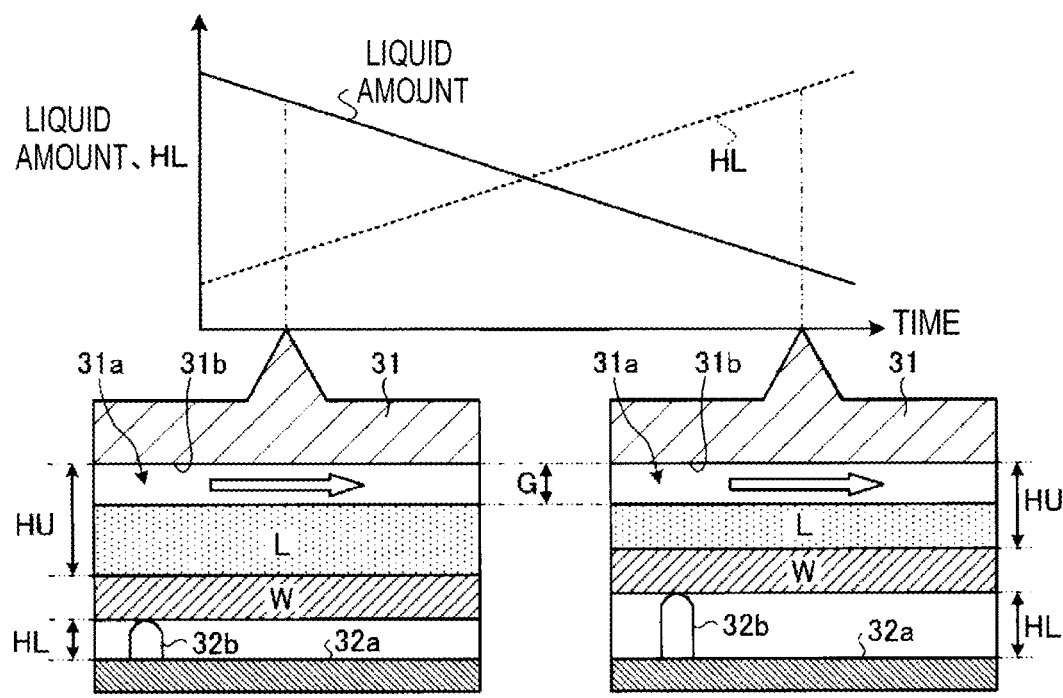
FIG. 10 is a view illustrating an example of a case where support members are moved up according to a liquid amount of a liquid film that varies during a drying process.
Figure 11:
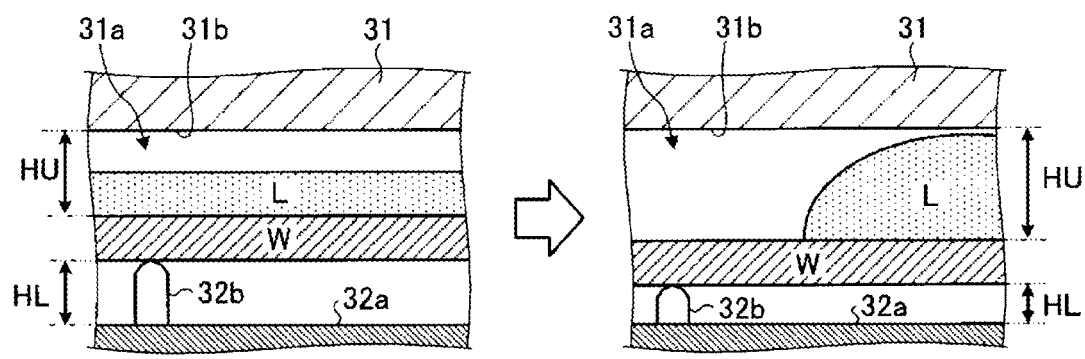
FIG. 11 is a view illustrating an example of a case where the support members are moved down according to the liquid amount of the liquid film that varies during the drying process.

Next, an example of the lifting control process using the liquid film variation information 62b will be described with reference to FIGS. 10 and 11. FIG. 10 is a view illustrating an example of a case where the support members 32b are moved up according to the liquid amount of the liquid film L that varies during the drying process. FIG. 11 is a view illustrating an example of a case where the support members 32b are moved down according to the liquid amount of the liquid film L that varies during the drying process.

During the drying process, the liquid amount of the liquid film L decreases with a lapse of time. Thus, the gap between the ceiling surface 31b of the processing space 31a and the upper surface of the liquid film L which is the flow path of the supercritical fluid gradually increases with the decrease of the liquid amount of the liquid film L. As a result, the flow rate or flow velocity of the supercritical fluid that flows along the upper surface of the liquid film L varies with the lapse of time.

Thus, the lifting controller 61b may move the plurality of support members 32b up during the drying process according to the liquid amount that varies during the drying process, based on the liquid film variation information 62b. Specifically, as illustrated in FIG. 10, the lifting controller 61b moves the plurality of support members 32b up during the drying process, such that the size (the distance G) of the gap between the ceiling surface 31b of the processing space 31a and the upper surface of the liquid film L becomes constant during the drying process.

As a result, the size of the gap between the ceiling surface 31b of the processing space 31a and the upper surface of the liquid film L which is the flow path of the supercritical fluid may be made constant, regardless of the variation in liquid amount of the liquid film L during the drying process. That is, the flow rate or flow velocity of the supercritical fluid that flows through the gap between the ceiling surface 31b of the processing space 31a and the upper surface of the liquid film L may be made constant, regardless of the variation in liquid amount of the liquid film L during the drying process.

In this way, the lifting controller 61b may move the plurality of support members 32b up during the drying process, according to the liquid amount of the liquid film L during the drying process. As a result, for example, the size of the gap between the ceiling surface 31b of the processing space 31a and the upper surface of the liquid film L may be continuously maintained during the drying process, such that the flow rate or flow velocity of the supercritical fluid flowing on the upper surface of the liquid film L becomes the flow rate or flow velocity suitable for the drying process.

The lifting controller 61b may move the plurality of support members 32b up during the drying process according to the film thickness of the liquid film L that varies during the drying process, based on the liquid film variation information 62b.

As illustrated in FIG. 11, during the drying process, the IPA liquid forming the liquid film L may be aggregated, and thus, the film thickness of the liquid film L may become thicker than the film thickness before the start of the drying process. In this case, the aggregated liquid film L may come into contact the ceiling surface 31b of the processing space 31a, and as a result, the amount of particles of the wafer W may increase after the drying process is performed.

Thus, the lifting controller 61b may move the plurality of support members 32b down during the drying process according to the film thickness of the liquid film L that varies during the drying process, based on the liquid film variation information 62b. Specifically, the lifting controller 61b moves the plurality of support members 32b down, such that the distance HU between the ceiling surface 31b of the processing space 31a and the upper surface of the wafer W becomes larger than the film thickness of the aggregated liquid film L.

As a result, it is possible to suppress the aggregated liquid film L from coming into contact with the ceiling surface 31b of the processing space 31a. Accordingly, it is possible to suppress the increase in amount of particles of the wafer W after the drying process is performed.

Figure 12:
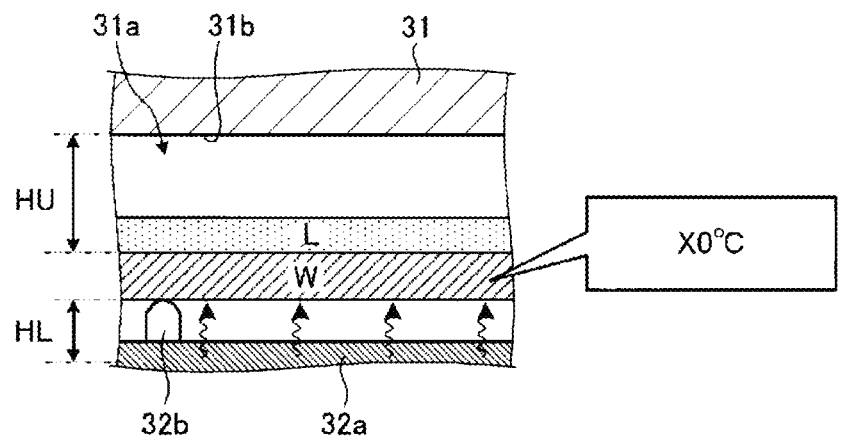
FIG. 12 is a view illustrating an example of a height position of a wafer during the drying process.
Figure 13:
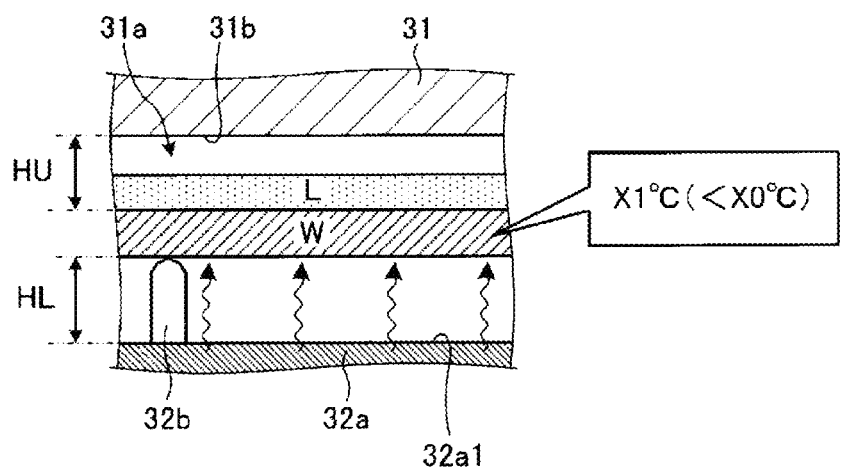
FIG. 13 is a view illustrating an example of a state where the height position of the wafer is changed according to wafer temperature information.

Next, an example of the lifting control process using the wafer temperature information 62c will be described with reference to FIGS. 12 and 13. FIG. 12 is a view illustrating an example of the height position of the wafer W during the drying process. FIG. 13 is a view illustrating an example where the height position of the wafer W is changed according to the wafer temperature information 62c.

As illustrated in FIG. 12, during the drying process, the wafer W may be heated to a temperature higher than a desired temperature due to the radiant heat from the base 32a formed of, for example, metal.

Thus, the lifting controller 61b may control the plurality of lifting mechanisms 32c to move the plurality of support members 32b up or down, based on the wafer temperature information 62c such that the temperature of the wafer W does not become overly higher than the desired temperature during the drying process.

For example, the lifting controller 61b determines whether a difference between the temperature of the wafer W indicated by the wafer temperature information 62c (e.g., X0° C.) and the desired temperature (e.g., the processing temperature indicated by the recipe information 62a) deviates from a normal range. When it is determined that the difference deviates from the normal range, the lifting controller 61b moves the plurality of support members 32b up or down to change the height position of the wafer W before the start of the drying process. For example, when the difference between X0° C. and the processing temperature exceeds the normal range, the lifting controller 61b moves the plurality of support members 32b up so as to increase the gap between the lower surface of the wafer W and the bottom surface 32a1 of the base 32a as illustrated in FIG. 13. Accordingly, it is possible to suppress the influence of the radiant heat from the base 32a on the wafer W, and as a result, the temperature of the wafer W during the drying process may be lowered to X1° C. which is lower than X0° C., that is, relatively closer to the desired temperature.

In this way, the lifting controller 61b may move the plurality of support members 32b up or down based on the wafer temperature information indicating the temperature of the wafer W during the drying process. As a result, the temperature of the wafer W during the drying process may be made relatively close to the desired temperature, so that the collapse of patterns formed on the upper surface of the wafer W may be suppressed.

Figure 14:
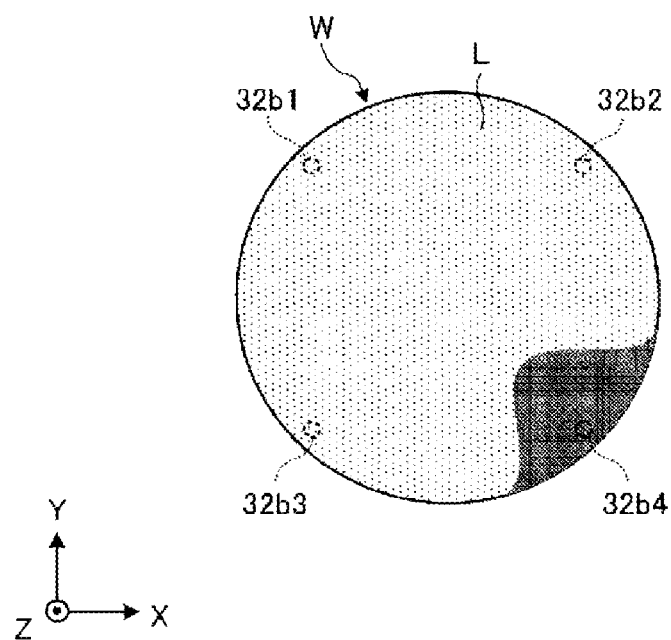
FIG. 14 is a view illustrating an example of a state where an inclination of a wafer supported by a plurality of support members occurs.
Figure 15:
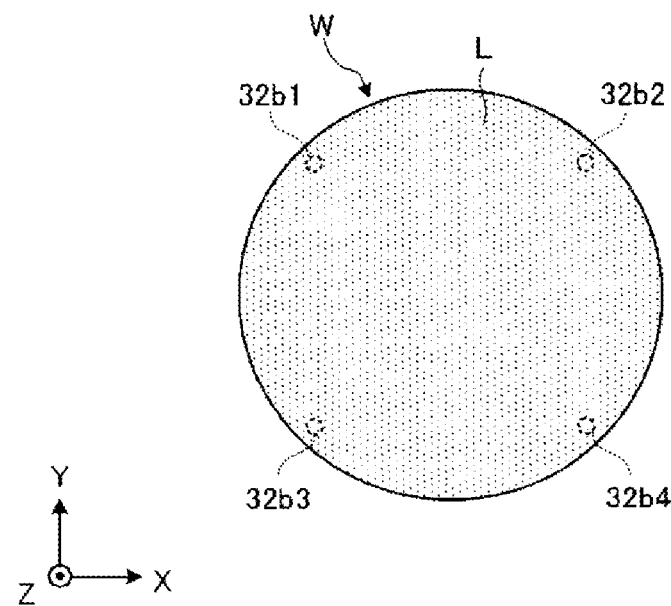
FIG. 15 is a view illustrating an example of a state where the inclination of the wafer is eliminated by a lifting control process.

Next, an example of the lifting control process using the inclination information 62e will be described with reference to FIGS. 14 and 15. FIG. 14 is a view illustrating an example of a state where the inclination of the wafer W supported by the plurality of support members 32b occurs. FIG. 15 is a view illustrating an example of a state where the inclination of the wafer W is eliminated by the lifting control process.

When the wafer W supported by the plurality of support members 32b is warped or inclined, the in-plane uniformity of the film thickness of the liquid film L may be deteriorated, and thus, the performance of the drying process may be deteriorated. For example, FIG. 14 represents a state where the film thickness of the liquid film L increases around the support member 32b4 among the plurality of support members 32b1 to 32b4, as compared to that around the other support members.

In this case, the lifting controller 61b may individually move the plurality of support members 32b1 to 32b4 up or down based on the inclination information 62e, such that the warpage or inclination of the wafer W is eliminated. For example, in the case illustrated in FIG. 14, the inclination of the wafer W may be eliminated by moving the support member 32b4 up. As a result, as illustrated in FIG. 15, the uniformity of the film thickness of the liquid film L may be improved, so that the collapse of patterns formed on the upper surface of the wafer W may be suppressed.

[7. Modifications]

Figure 16:
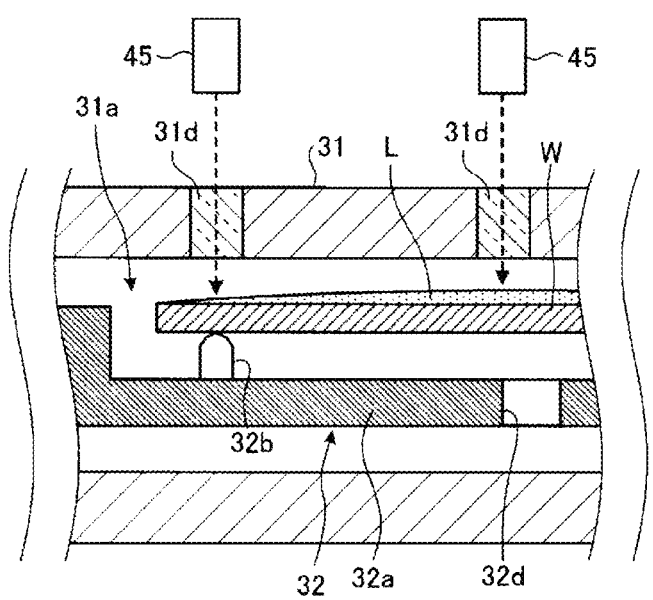
FIG. 16 is a view illustrating an arrangement of film thickness sensors according to a modification.

In the embodiment described above, an example where the plurality of film thickness sensors 45 are arranged in the delivery region 182 (see FIG. 1) has been described. However, the plurality of film thickness sensors 45 may be arranged in the processing region 181. FIG. 16 is a view illustrating the arrangement of the film thickness sensors 45 according to the modification.

For example, as illustrated in FIG. 16, the plurality of film thickness sensors 45 may be arranged above the processing container 31, and measure the film thickness of the liquid film L formed on the upper surface of the wafer W placed in the processing space 31a through a plurality of transparent portions 31d provided in the processing container 31. With this configuration, it is possible to move the plurality of support members 32b up or down during the drying process, according to the film thickness of the liquid film L actually measured during the drying process.

In FIG. 16, instead of the plurality of film thickness sensors 45, a plurality of image sensors may be arranged above the processing container 31. In this case, the information acquisition unit 61a may acquire information such as the liquid amount or film thickness of the liquid film L from images of the liquid film L that are captured by the plurality of image sensors during the drying process.

In the embodiment described above, an example where the weight sensor 40, the displacement sensors 43, and the film thickness sensors 45 are provided in the drying processing unit 18 has been described. However, these components may not necessarily be provided in the drying processing unit 18. For example, the substrate processing system 1 may be provided with an inspection unit including at least one of the weight sensor 40, the displacement sensors 43, and the film thickness sensors 45.

As described above, the substrate processing apparatus according to the embodiment (e.g., the drying processing unit 18) is a substrate processing apparatus that performs the drying process for drying a substrate (e.g., the wafer W) having the pattern formation surface on which a liquid film (e.g., the liquid film L) has been formed, using a processing fluid in a supercritical state, and includes a processing container (e.g., the processing container 31), a holder (e.g., the holder 32), and a supply (e.g., the fluid supply headers 37A and 37B). The processing container accommodates the substrate. The holder holds the substrate inside the processing container. The supply supplies a processing fluid into the processing container. Further, the holder includes a base (e.g., the base 32a), a plurality of support members (e.g., the plurality of support members 32b), and a lifting mechanism (e.g., the plurality of lifting mechanisms 32c). The base is disposed below the substrate. The plurality of support members are provided on the base, and support the substrate from below. The lifting mechanism moves the plurality of support members up and down.

As described above, when the plurality of support members that support the substrate are configured to be movable up and down, it is possible to accurately and easily control the processing conditions that rely on the length of the support members, such as the flow rate or flow velocity of the supercritical fluid. Accordingly, the collapse of patterns formed on the upper surface of the substrate may be suppressed. Further, for example, as compared with a case where the length of a support member is changed by replacing the support member with a support member having a different length, the replacing task is unnecessary.

The substrate processing apparatus according to the embodiment may further include a lifting controller (e.g., the lifting controller 61b) that controls the lifting mechanism. In this case, the lifting controller may move the plurality of support members up or down according to the liquid amount or film thickness of the liquid film.

The substrate processing apparatus according to the embodiment may include an acquisition unit (e.g., the information acquisition unit 61a) that acquires the liquid amount or film thickness of the liquid film formed on the substrate before the substrate is accommodated in the processing container. In this case, the lifting controller may move the plurality of support members up or down according to the liquid amount or film thickness acquired by the acquisition unit.

As a result, for example, the size of the gap between the ceiling surface of the processing container and the upper surface of the liquid film may be accurately set, such that the flow rate or flow velocity of the supercritical fluid flowing on the upper surface of the liquid film become the flow rate or flow velocity suitable for the drying process.

The substrate processing apparatus according to the embodiment may further include an acquisition unit (e.g., the information acquisition unit 61a) that acquires liquid film variation information indicating a variation in liquid amount or film thickness of the liquid film over time during the drying process. In this case, the lifting controller may move the plurality of support members up or down according to the liquid amount or film thickness that varies during the drying process, based on the liquid film variation information acquired by the acquisition unit.

As a result, for example, the size of the gap between the ceiling surface of the processing container and the upper surface of the liquid film may be continuously maintained during the drying process, such that the flow rate or flow velocity of the supercritical fluid flowing on the upper surface of the liquid film becomes the flow rate or flow velocity suitable for the drying process.

The substrate processing apparatus according to the embodiment may further include a lifting controller (e.g., the lifting controller 61b) and an acquisition unit (e.g., the information acquisition unit 61a). The lifting controller controls the lifting mechanism. The acquisition unit acquires the inclination of the substrate supported by the plurality of support members. The lifting mechanism may be capable of individually moving the plurality of support members up and down. In this case, the lifting controller may individually move the plurality of support members up or down according to the inclination of the substrate acquired by the acquisition unit.

When the plurality of supporting members are individually moved up or down so as to eliminate the inclination of the substrate, the uniformity of the film thickness of the liquid film may be improved, so that the collapse of patterns formed on the upper surface of the substrate may be suppressed.

The lifting controller may move the plurality of support members up or down according to the liquid amount or film thickness of the liquid film, such that the distance between the upper surface of the liquid film and the ceiling surface (e.g., the ceiling surface 31b) of the processing container (e.g., the processing space 31a) becomes constant. When the size of the gap between the upper surface of the liquid film and the ceiling surface of the processing container which is the flow path of the supercritical fluid becomes constant, the flow rate or flow velocity of the supercritical fluid may be made constant, regardless of the liquid amount of the liquid film.

The acquisition unit may be at least one of a film thickness sensor (e.g. the film thickness sensor 45), an image sensor, a weight sensor (e.g., the weight sensor 40), and a displacement sensor (e.g., the displacement sensor 43). As a result, the liquid amount or film thickness of the liquid film may be acquired.

According to the present disclosure, with a technique of drying a substrate using a processing fluid in a supercritical state, it is possible to suppress the collapse of patterns formed on the upper surface of the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a processing container configured to accommodate a substrate with a liquid film formed on a pattern formation surface thereof;
    a holder configured to hold the substrate thereon inside the processing container;
    a processing fluid supply configured to supply a processing fluid in a supercritical state into the processing container for a drying process of the substrate; and
    a controller configured to control an overall operation of the substrate processing apparatus,
    wherein the holder includes a base disposed below the substrate, a plurality of support pins provided on the base and configured to support the substrate from below, and a lifting motor configured to move the plurality of support pins up and down, and
    the controller controls the lifting motor to move the plurality of support pins up or down according to a liquid amount or a film thickness of the liquid film.

2. The substrate processing apparatus according to claim 1, wherein the controller is further configured to acquire the liquid amount or the film thickness of the liquid film formed on the substrate, before the substrate is accommodated in the processing container,
    wherein the controller moves the plurality of support pins up or down according to the acquired liquid amount or the film thickness.

3. The substrate processing apparatus according to claim 1, wherein the controller is further configured to acquire liquid film variation information indicating a variation in liquid amount or film thickness of the liquid film over time during the drying process,
    wherein the controller moves the plurality of support pins up or down according to the liquid amount or the film thickness that varies during the drying process, based on the acquired liquid film variation information.

4. A substrate processing apparatus comprising:
    a processing container configured to accommodate a substrate with a liquid film formed on a pattern formation surface thereof;
    a holder configured to hold the substrate thereon inside the processing container;
    a processing fluid supply configured to supply a processing fluid in a supercritical state into the processing container for a drying process of the substrate; and a controller configured to control an overall operation of the substrate processing apparatus, wherein the holder includes a base disposed below the substrate, a plurality of support pins provided on the base and configured to support the substrate from below, and a lifting motor configured to move the plurality of support pins up and down, and wherein the controller is further configured to acquire an inclination of the substrate supported by the plurality of support pins, the lifting motor is capable of individually moving the plurality of support pins up and down, and the controller controls the lifting motor to individually move the plurality of support pins up or down according to the acquired inclination of the substrate.

5. The substrate processing apparatus according to claim 1, wherein the controller moves the plurality of support pins up or down according to the liquid amount or the film thickness of the liquid film such that a distance between an upper surface of the liquid film and a ceiling surface of the processing container becomes constant.

6. The substrate processing apparatus according to claim 2, wherein the controller moves the plurality of support pins up or down according to the liquid amount or the film thickness of the liquid film such that a distance between an upper surface of the liquid film and a ceiling surface of the processing container becomes constant.

7. The substrate processing apparatus according to claim 3, wherein the controller moves the plurality of support pins up or down according to the liquid amount or the film thickness of the liquid film such that a distance between an upper surface of the liquid film and a ceiling surface of the processing container becomes constant.

8. The substrate processing apparatus according to claim 2, wherein the controller acquires the liquid amount or the film thickness of the liquid film formed on the substrate from at least one of a film thickness sensor, an image sensor, a weight sensor, and a displacement sensor.

9. The substrate processing apparatus according to claim 3, wherein the controller acquires the liquid film variation information from at least one of a film thickness sensor, an image sensor, a weight sensor, and a displacement sensor.

10. The substrate processing apparatus according to claim 4, wherein the controller acquires the inclination of the substrate from at least one of a film thickness sensor, an image sensor, a weight sensor, and a displacement sensor.

11. A drying method comprising:

holding a substrate with a liquid film formed on a pattern formation surface thereof inside a processing container, using a holder that holds the substrate, the holder including a base disposed below the substrate and a plurality of support pins provided on the base and being configured to support the substrate from below;

supplying a processing fluid in a supercritical state into the processing container; and moving at least one of the plurality of support pins included in the holder up or down according to a liquid amount or a film thickness of the liquid film.

12. The drying method according to claim 11, further comprising:

acquiring the liquid amount or the film thickness of the liquid film before the substrate is accommodated in the processing container; and moving the plurality of support pins up or down according to the liquid amount or the film thickness acquired at the acquiring.

\* \* \* \* \*